(12) United States Patent
Kang et al.

(10) Patent No.: US 10,861,505 B2
(45) Date of Patent: Dec. 8, 2020

(54) NONVOLATILE MEMORY APPARATUS FOR MITIGATING SNAP-BACK DISTURBANCE, AND READ AND WRITE METHOD OF THE NONVOLATILE MEMORY APPARATUS

(71) Applicant: SK hynix Inc., Icheon-si (KR)

(72) Inventors: Seok Joon Kang, Seoul (KR); Jin Su Park, Icheon-si (KR); Ho Seok Em, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/289,981

(22) Filed: Mar. 1, 2019

(65) Prior Publication Data

US 2019/0385644 A1 Dec. 19, 2019

(30) Foreign Application Priority Data

Jun. 18, 2018 (KR) ........................ 10-2018-0069622

(51) Int. Cl.
*G11C 13/00* (2006.01)
*G11C 5/06* (2006.01)
*G11C 5/14* (2006.01)
*G05F 3/02* (2006.01)

(52) U.S. Cl.
CPC ................ *G11C 5/063* (2013.01); *G05F 3/02* (2013.01); *G11C 5/147* (2013.01); *G11C 13/004* (2013.01); *G11C 2013/0045* (2013.01)

(58) Field of Classification Search
CPC ....... G11C 5/063; G11C 5/147; G11C 13/004; G11C 2013/0045; G05F 3/02
See application file for complete search history.

(56) References Cited

U.S. PATENT DOCUMENTS

| | | | | |
|---|---|---|---|---|
| 9,437,293 B1* | 9/2016 | Kripanidhi | ......... | G11C 13/0064 |
| 2010/0142254 A1* | 6/2010 | Choi | .......... | G11C 13/004 365/148 |
| 2011/0286259 A1* | 11/2011 | Perner | ................ | G11C 13/0002 365/148 |
| 2011/0292713 A1* | 12/2011 | Perner | ................ | G11C 13/0002 365/148 |
| 2013/0044539 A1* | 2/2013 | Hirst | ......................... | G11C 7/06 365/163 |
| 2013/0051137 A1* | 2/2013 | Zeng | .................. | G11C 13/0061 365/163 |
| 2014/0362650 A1* | 12/2014 | Castro | ................ | G11C 13/0028 365/189.011 |
| 2015/0063021 A1* | 3/2015 | Castro | ...................... | G11C 8/12 365/163 |

(Continued)

*Primary Examiner* — Mushfique Siddique
(74) *Attorney, Agent, or Firm* — William Park & Associates Ltd.

(57) ABSTRACT

A non-volatile memory apparatus includes a memory cell coupled between a global bit line and a global word line. A bit line control circuit configured to apply a bit line read bias voltage to the global bit line based on a read signal. A snap-back detection circuit coupled to the global word line, and configured to generate a data output signal and a current enable signal by detecting a snap-back of the memory cell. A word line control circuit configured to apply a word line read bias voltage to the global word line based on the read signal, and may increase an amount of a current flowing through the memory cell based on the current enable signal.

20 Claims, 7 Drawing Sheets

(56) References Cited

U.S. PATENT DOCUMENTS

| | | | |
|---|---|---|---|
| 2015/0262661 A1* | 9/2015 | Chu | G11C 11/5678 |
| | | | 365/163 |
| 2016/0093375 A1* | 3/2016 | Srinivasan | G11C 8/08 |
| | | | 365/163 |
| 2016/0351258 A1* | 12/2016 | Taub | G11C 13/0069 |
| 2017/0262171 A1* | 9/2017 | Cheon | G06F 3/061 |
| 2019/0164611 A1* | 5/2019 | Castro | G11C 11/5678 |
| 2020/0066744 A1* | 2/2020 | Yun | G11C 5/063 |

\* cited by examiner

NONVOLATILE MEMORY APPARATUS FOR MITIGATING SNAP-BACK DISTURBANCE, AND READ AND WRITE METHOD OF THE NONVOLATILE MEMORY APPARATUS

CROSS-REFERENCES TO RELATED APPLICATION

The present application claims priority under 35 U.S.C. § 119(a) to Korean application number 10-2018-0069622, filed on Jun. 18, 2018, in the Korean Intellectual Property Office, which is incorporated herein by reference in its entirety.

BACKGROUND

1. Technical Field

Various embodiments of the present disclosure generally relate to a semiconductor technology and, more particularly, to a non-volatile memory apparatus and read and write method of the non-volatile memory apparatus.

2. Related Art

An electronic device includes a lot of electronic elements, and a computer system includes lots of semiconductor apparatuses each comprising a semiconductor. The computer system may include a memory apparatus. A dynamic random access memory (DRAM) is widely used as a general memory apparatus because of advantages it provides regarding the storage and outputting of data at fast and steady speeds with random access. However, the DRAM has a volatile characteristic whereby it loses stored data when powered off since it has a memory cell comprising a capacitor. A flash memory apparatus is disclosed for overcoming the disadvantages of the DRAM. The flash memory apparatus has a non-volatile characteristic whereby it keeps stored data even when powered off since it has a memory cell comprising a floating gate. However, the flash memory apparatus has disadvantages because it stores and outputs data at a slow speed and is not random accessible, when compared with the DRAM.

Next-generation memory apparatuses such as a phase change memory (PCM), a magnetic RAM (MRAM), a resistive RAM (ReRAM) and a ferroelectric RAM (FRAM) have advantages that provide fast operational speeds and non-volatile characteristics. Particularly, the PCM has a phase change memory cell comprising a chalcogenide and is capable of storing data by changing a resistive value of the memory cell.

SUMMARY

In an embodiment of the present disclosure, a non-volatile memory apparatus may include a memory cell, a bit line control circuit, a snap-back detection circuit, and a word line control circuit. The memory cell may be coupled between a global bit line and a global word line. The bit line control circuit may be configured to apply a bit line read bias voltage to the global bit line based on a read signal. The snap-back detection circuit may be coupled to the global word line, and may be configured to generate a data output signal and a current enable signal by detecting a snap-back of the memory cell. The word line control circuit may be configured to apply a word line read bias voltage to the global word line based on the read signal, and may increase an amount of a current flowing through the memory cell based on the current enable signal.

In an embodiment of the present disclosure, a non-volatile memory apparatus may include a memory cell, a bit line control circuit, a snap-back detection circuit, and a word line control circuit. The memory cell may be coupled between a global bit line and a global word line. The bit line control circuit may be configured to apply a bit line write bias voltage to the global bit line based on a write signal, and may variably change a voltage level of the global bit line based on the write signal and a current enable signal. The snap-back detection circuit may be coupled to the global word line, and may be configured to generate the current enable signal by detecting a snap-back of the memory cell. The word line control circuit may be configured to apply a word line write bias voltage to the global word line based on the write signal, and may increase an amount of a current flowing through the memory cell based on the current enable signal.

In an embodiment of the present disclosure, a read method of a non-volatile memory apparatus may include applying a read voltage, which is for causing a snap-back in a memory cell of a low resistance state, across a memory cell. The read method may include selectively increasing an amount of a current flowing the memory cell according to whether a snap-back of the memory cell occurs.

In an embodiment of the present disclosure, a write method of a non-volatile memory apparatus may include applying a write voltage, which is for causing a snap-back in a memory cell of a low resistance state or a memory cell of a high resistance state, across a memory cell coupled between a global bit line and a global word line; and may change an amount of a current flowing the memory cell according to a write signal and whether a snap-back of the memory cell occurs.

DETAILED DESCRIPTION

Hereinafter, a semiconductor apparatus according to the present disclosure will be described below with reference to the accompanying drawings through various embodiments.

Figure 1:
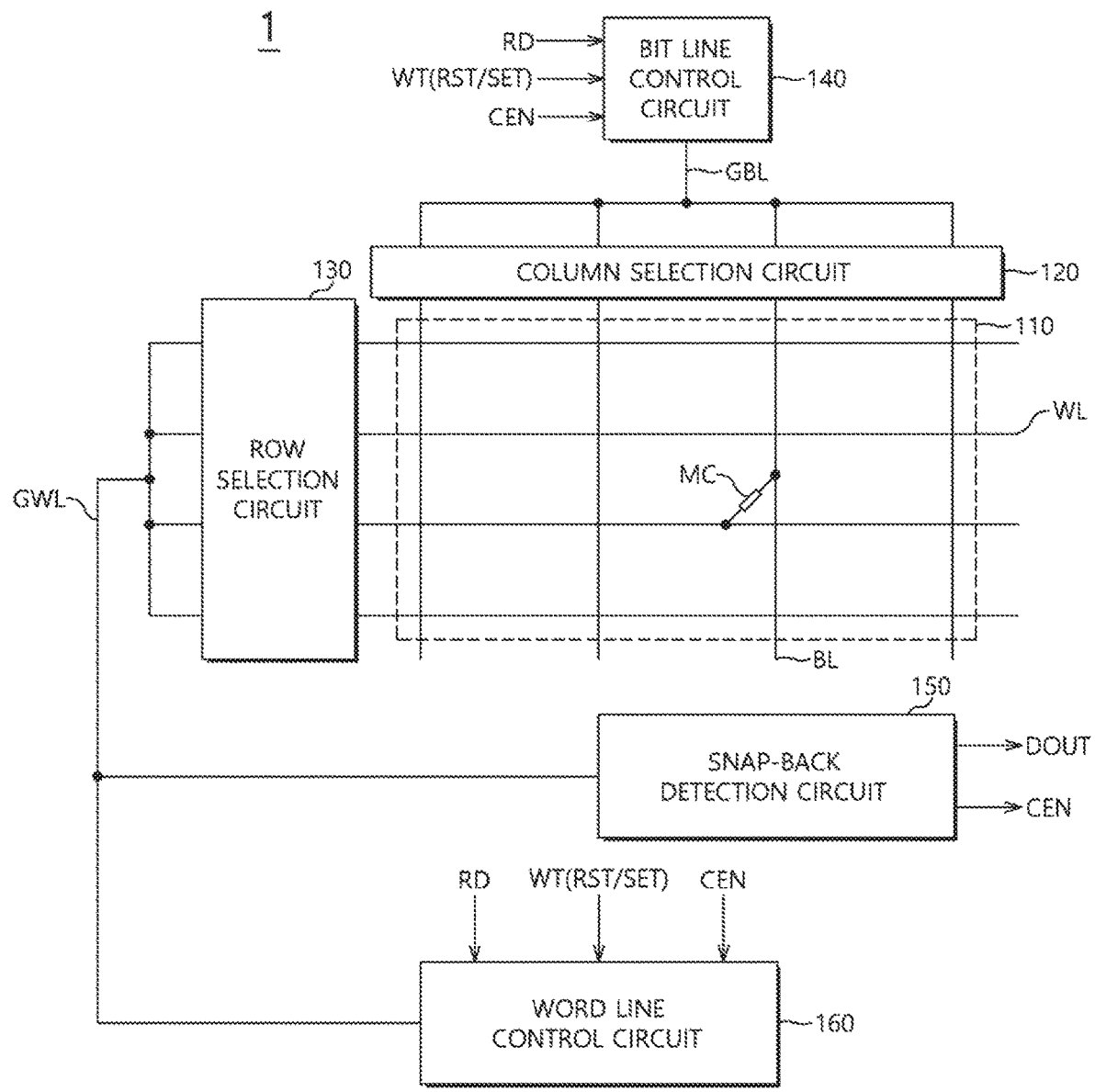
FIG. 1 illustrates a configuration of a non-volatile memory apparatus in accordance with an embodiment of the present disclosure.

FIG. 1 is a diagram illustrating a configuration of a non-volatile memory apparatus 1 in accordance with an embodiment of the present disclosure. Referring to FIG. 1, the non-volatile memory apparatus 1 may include a memory array 110. A plurality of bit lines BL may be disposed in a column direction of the memory array 110 and a plurality of word lines WL may be disposed in a row direction of the memory array 110. A plurality of memory cells MC may be coupled to cross points formed by the plurality of bit lines BL and the plurality of word lines WL. Each of the plurality of memory cells MC may be coupled between a corresponding bit line BL and a corresponding word line WL among the plurality of bit lines BL and the plurality of word lines WL. Each of the plurality of memory cells MC may be configured by a resistance change element and, for example, may comprise a phase change material. The non-volatile memory apparatus 1 may be a phase change memory apparatus. The memory array 110 may be a cross-point array.

The non-volatile memory apparatus 1 may include a column selection circuit 120 and a row selection circuit 130. The column selection circuit 120 may be coupled between a global bit line GBL and the plurality of bit lines BL. The column selection circuit 120 may couple the global bit line GBL to a selected one among the plurality of bit lines BL. Although not illustrated, the column selection circuit 120 may couple the global bit line GBL to a selected one among the plurality of bit lines BL based on a column selection signal, which is generated on the basis of a column address signal. The row selection circuit 130 may be coupled between a global word line GWL and the plurality of word lines WL. The row selection circuit 130 may couple the global word line GWL to a selected one among the plurality of word lines WL. Although not illustrated, the row selection circuit 130 may couple the global word line GWL to a selected one among the plurality of word lines WL based on a row selection signal, which is generated on the basis of a row address signal.

The non-volatile memory apparatus 1 may further include a bit line control circuit 140, a snap-back detection circuit 150 and a word line control circuit 160. The bit line control circuit 140 may be coupled to the global bit line GBL. The bit line control circuit 140 may change the voltage level of the global bit line GBL for read and write operations of the non-volatile memory apparatus 1. The bit line control circuit 140 may receive a read signal RD, a write signal WT(RST/SET) and a current enable signal CEN and may drive the global bit line GBL to one or more voltages.

The read signal RD may be enabled while the non-volatile memory apparatus 1 performs a read operation. The non-volatile memory apparatus 1 may perform a read operation of reading data stored in the memory array 110 and outputting the read data to an external apparatus of the non-volatile memory apparatus 1. The write signal WT(RST/SET) may be enabled while the non-volatile memory apparatus 1 performs a write operation. The non-volatile memory apparatus 1 may perform a write operation of storing or programming data, which is provided from an external apparatus, into the memory array 110. The write operation may include a reset write operation and a set write operation. The write signal WT(RST/SET) may include a reset write signal RST and a set write signal SET. The memory cells MC may store data as they programmed as in a low resistance state and a high resistance state. In an embodiment, the memory cells MC may be in a plurality of low resistance states and a plurality of high resistance states and may store multi-bit data. The reset write signal RST may direct the non-volatile memory apparatus 1 to program the memory cells MC as in the high resistance state and the set write signal SET direct the non-volatile memory apparatus 1 to program the memory cells MC as in the low resistance state. The current enable signal CEN may be generated by the snap-back detection circuit 150, which will be described later.

The bit line control circuit 140 may apply a bit line bias voltage to the global bit line GBL based on the read signal RD or the write signal WT(RST/SET). For example, the bit line control circuit 140 may apply a bit line read bias voltage to the global bit line GBL based on the read signal RD during the read operation. The bit line control circuit 140 may apply a bit line write bias voltage to the global bit line GBL based on the write signal WT(RST/SET) during the write operation. The bit line write bias voltage may have a higher level than the bit line read bias voltage. As described later, the level of the bit line read bias voltage may set such that a voltage corresponding to a read voltage is applied across the memory cell MC and the level of the bit line write bias voltage may be set such that a voltage corresponding to a write voltage is applied across the memory cell MC.

The bit line control circuit 140 may increase or decrease the voltage level of the global bit line GBL based on the current enable signal CEN and the write signal WT(RST/SET). The bit line control circuit 140 may increase the voltage level of the global bit line GBL based on the current enable signal CEN and the reset write signal RST and may decrease the voltage level of the global bit line GBL based on the current enable signal CEN and the set write signal SET. For example, the bit line control circuit 140 may drive the global bit line GBL to the bit line write bias voltage and may drive, when the current enable signal CEN is enabled, the global bit line GBL to a first high voltage having a higher level than the bit line write bias voltage, during a reset write operation. The bit line control circuit 140 may drive the global bit line GBL to the bit line write bias voltage and may drive, when the current enable signal CEN is enabled, the global bit line GBL to a second high voltage having a lower level than the bit line write bias voltage, during a set write operation.

The snap-back detection circuit 150 may be coupled to the global word line GWL. The snap-back detection circuit 150 may detect whether a snap-back occurs in the memory cell MC by detecting the voltage level of the global word line GWL. The snap-back detection circuit 150 may generate the current enable signal CEN based on whether a snap-back occurs in the memory cell MC during the read and write operations. For example, the snap-back detection circuit 150 may keep the current enable signal CEN disabled while a snap-back does not occur and may enable the current enable signal CEN when a snap-back occurs. The snap-back detection circuit 150 may generate a data output signal DOUT and the current enable signal CEN based on whether a snap-back occurs in the memory cell MC during the read operation. For example, the snap-back detection circuit 150 may generate, when a snap-back occurs in the memory cell MC, the data output signal DOUT having a particular logic level by detecting the low resistance state of the memory cell MC. For example, the snap-back detection circuit 150 may generate, while a snap-back does not occur in the memory cell MC, the data output signal DOUT having an opposite logic level to the particular logic level by detecting the high resistance state of the memory cell MC. The snap-back detection circuit 150 may generate the current enable signal CEN based on whether a snap-back occurs in the memory cell MC during the write operation.

The word line control circuit 160 may be coupled to the global word line GWL. The word line control circuit 160 may change the voltage level of the global word line GWL for the read and write operations of the non-volatile memory apparatus 1. The word line control circuit 160 may receive the read signal RD, the write signal WT(RST/SET) and the current enable signal CEN and may drive the global word line GWL to one or more voltages. The word line control circuit 160 may change a current flowing through the memory cell MC by changing a current flowing through the global word line GWL based on the read signal RD, the write signal WT(RST/SET) and the current enable signal CEN.

The word line control circuit 160 may apply a word line bias voltage to the global word line GWL based on the read signal RD and the write signal WT(RST/SET). For example, the word line control circuit 160 may apply a word line read bias voltage to the global word line GWL based on the read signal RD during the read operation. The word line control circuit 160 may apply a word line write bias voltage to the global word line GWL based on the write signal WT(RST/SET) during the write operation. The word line write bias voltage may have a lower level than the word line read bias voltage. The level of the word line read bias voltage may set such that voltage level difference between the bit line read bias voltage and the word line read bias voltage corresponds to the level of the read voltage. The level of the word line write bias voltage may set such that voltage level difference between the bit line write bias voltage and the word line write bias voltage corresponds to the level of the write voltage.

During the read operation, when a snap-back of the memory cell MC occurs, a spike current may flow through the memory cell MC due to the snap-back. The word line control circuit 160 may increase an amount of the current flowing through the memory cell MC after the snap-back of the memory cell MC is occurred. The word line control circuit 160 may increase an amount of the current flowing through the memory cell MC by increasing an amount of a current flowing through the global word line GWL based on the current enable signal CEN. For example, the word line control circuit 160 may control a first current to flow through the global word line GWL so that a snap-back of the memory cell MC occurs. After the snap-back of the memory cell MC occurs, the word line control circuit 160 may increase the amount of a current flowing through the global word line GWL by controlling an additional current to flow through the global word line GWL. The increased current may be an annealing current. The annealing current may keep and/or form the resistance state of the memory cell MC as the low resistance state. In an embodiment, the word line control circuit 160 may increase, when a snap-back of the memory cell MC occurs, the amounts of currents flowing through the global word line GWL and the memory cell MC by lowering the voltage level of the global word line GWL. The word line control circuit 160 may drive, based on the current enable signal CEN, the global word line GWL to a first low voltage having a lower level than the word line read bias voltage.

During the write operation, when a snap-back of the memory cell MC occurs, a spike current may flow through the memory cell MC due to the snap-back. The word line control circuit 160 may increase an amount of the current flowing through the memory cell MC after the snap-back of the memory cell MC occurs. For example, the word line control circuit 160 may control a second current to flow through the global word line GWL so that a snap-back of the memory cell MC occurs. The word line control circuit 160 may increase the amount of a current flowing through the memory cell MC by increasing an amount of a current flowing through the global word line GWL based on the current enable signal CEN, the reset write signal RST and the set write signal SET. When the current enable signal CEN is enabled during the reset write operation, the word line control circuit 160 may control a third current to flow through the global word line GWL. When the current enable signal CEN is enabled during the set write operation, the word line control circuit 160 may control a fourth current to flow through the global word line GWL. The third current may be greater than the fourth current and the fourth current may be equal to or greater than the second current. In an embodiment, the word line control circuit 160 may increase, when a snap-back of the memory cell MC occurs, the amount of a current flowing through the memory cell MC by lowering the voltage level of the global word line GWL. The word line control circuit 160 may drive, based on the reset write signal RST and the current enable signal CEN, the global word line GWL to a second low voltage having a lower level than the word line write bias voltage. The word line control circuit 160 may drive, based on the set write signal SET and the current enable signal CEN, the global word line GWL to a third low voltage having a lower level than the word line write bias voltage. The second low voltage may have a lower level than the third low voltage, and the third low voltage may have a level equal to or lower than the first low voltage.

Figure 2:
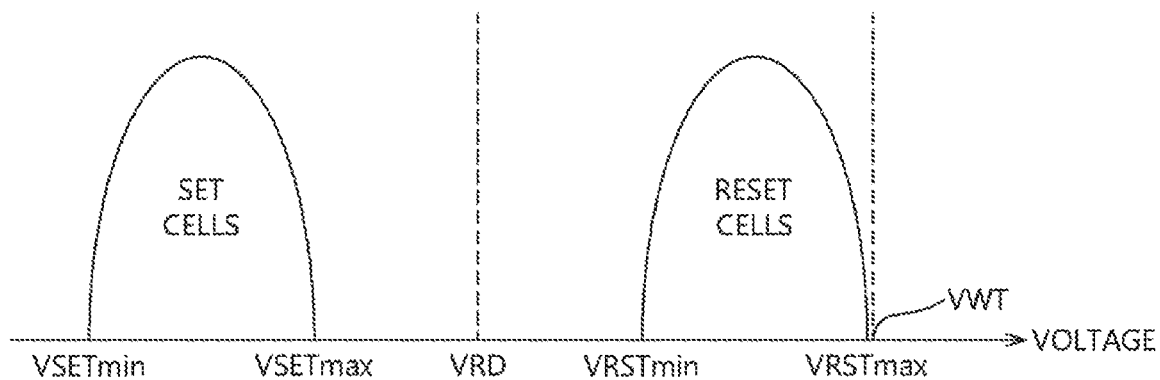
FIG. 2 illustrates a threshold voltage of a memory cell according to resistive distribution of the memory cell.

FIG. 2 is a diagram illustrating a threshold voltage of a memory cell according to resistive distribution of the memory cell. Referring to FIG. 2, memory cells of the low resistance state may be set cells SET CELLS and memory cell of the high resistance state may be reset cells RESET CELLS. The threshold voltages of the set cells SET CELLS may be distributed between a set distribution minimum voltage VSETmin and a set distribution maximum voltage VSETmax. The threshold voltages of the reset cells RESET CELLS may be distributed between a reset distribution minimum voltage VRSTmin and a reset distribution maximum voltage VRSTmax. In accordance with an embodiment of the present disclosure, the read voltage VRD may have a voltage level between the set distribution maximum voltage VSETmax and the reset distribution minimum voltage VRSTmin such that a snap-back in the set cells SET CELLS can occur during the read operation. For example, the read voltage VRD may have a voltage level corresponding to the middle of the set distribution maximum voltage VSETmax and the reset distribution minimum voltage VRSTmin. The voltage levels of bit line read bias voltage and the word line read bias voltage may be set such that the voltage across the memory cell MC becomes the voltage level of the read voltage VRD during the read operation.

The write voltage VWT may have a higher voltage level than the reset distribution maximum voltage VRSTmax such that a snap-back in the reset cells RESET CELLS as well as in the set cells SET CELLS can occur during the write operation. The voltage levels of bit is line write bias voltage and the word line write bias voltage may be set such that the voltage across the memory cell MC becomes the level of the write voltage VWT during the write operation.

Figure 3:
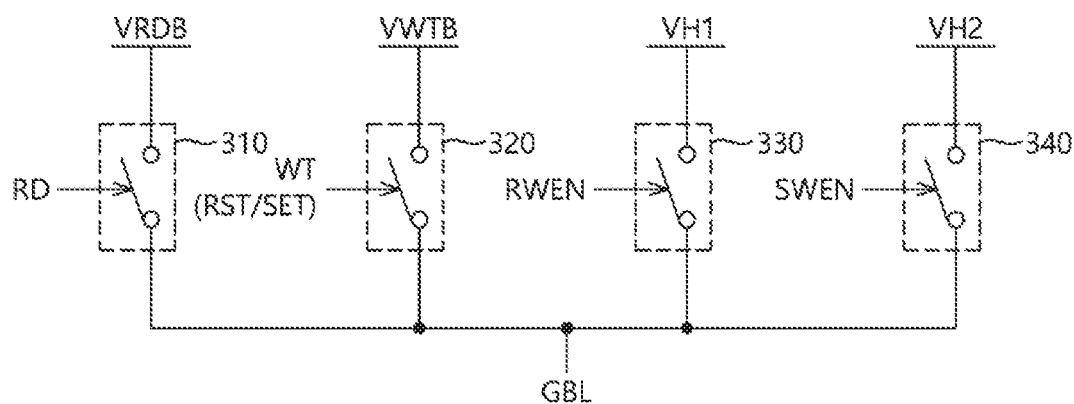
FIG. 3 illustrates a configuration of a bit line control circuit illustrated in FIG. 1.
Figure 3:
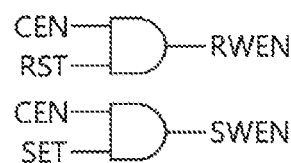
Figure 4:
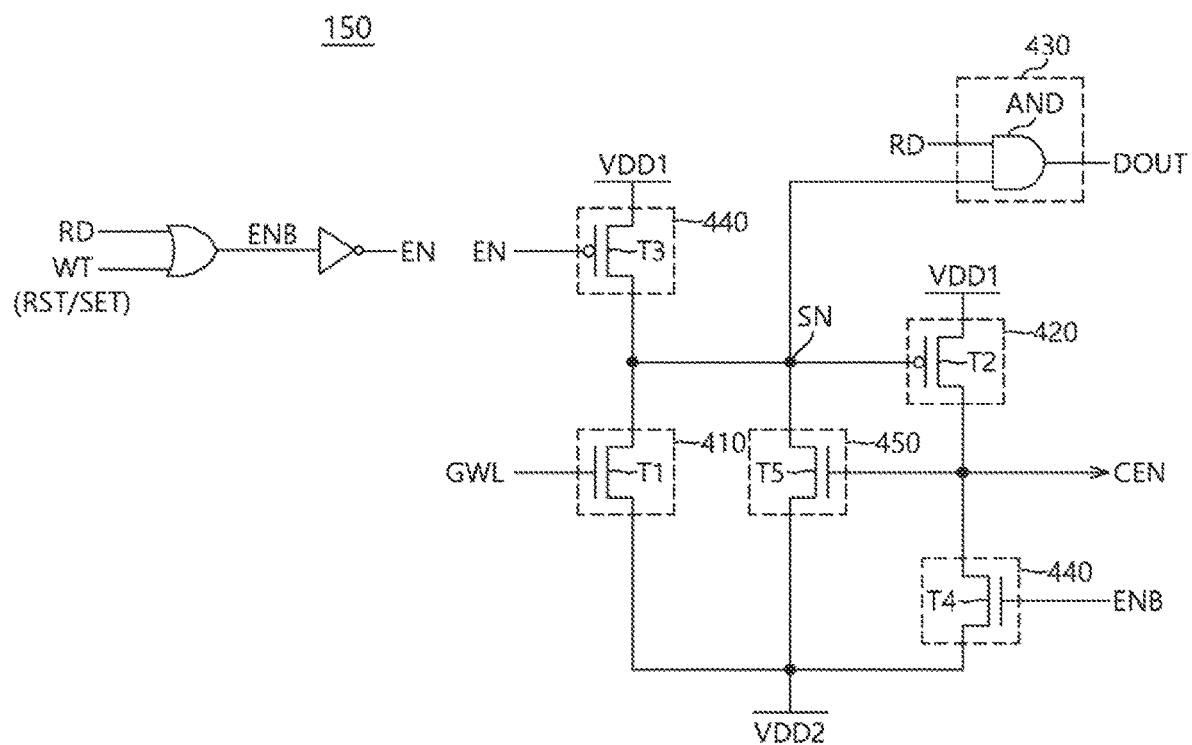
FIG. 4 illustrates a configuration of a snap-back detection circuit illustrated in FIG. 1.

FIG. 3 is a diagram illustrating a configuration of the bit line control circuit 140 illustrated in FIG. 1. Referring to FIG. 3, the bit line control circuit 140 may include a first high voltage supply unit 310, a second high voltage supply unit 320, a third high voltage supply unit 330 and a fourth high voltage supply unit 340. The first to fourth high voltage supply units 310, 320, 330 and 340 may be coupled in common to the global bit line GBL. The first high voltage supply unit 310 may drive the global bit line GBL to the voltage level of the bit line read bias voltage VRDB by supplying the bit line read bias voltage VRDB to the global bit line GBL based on the read signal RD. The second high voltage supply unit 320 may drive the global bit line GBL to the voltage level of the bit line write bias voltage VWTB by supplying the bit line write bias voltage VWTB to the global bit line GBL based on the write signal WT(RST/SET). The third high voltage supply unit 330 may drive the global bit line GBL to a voltage level of a first high voltage VH1 by supplying the first high voltage VH1 to the global bit line GBL based on a reset write enable signal RWEN. The reset write enable signal RWEN may be enabled when both of the reset write signal RST and the current enable signal CEN are enabled. The first high voltage VH1 may have a higher voltage level than the bit line write bias voltage VWTB to allow the memory cell MC to be in the high resistance state. The fourth high voltage supply unit 340 may drive the global bit line GBL to a voltage level of a second high voltage VH2 by supplying the second high voltage VH2 to the global bit line GBL based on a set write enable signal SWEN. The set write enable signal SWEN may be enabled when both of the set write signal SET and the current enable signal CEN are enabled. The second high voltage VH2 may have a lower voltage level than the bit line write bias voltage VWTB, FIG. 4 is a diagram illustrating a configuration of the snap-back detection circuit 150 illustrated in FIG. 1. Referring to FIG. 4, the snap-back detection circuit 150 may include a sensing unit 410, a current enable signal generation unit 420 and a data output unit 430. The sensing unit 410 may be coupled to the global word line GWL. The sensing unit 410 may change the voltage level of the sensing node SN based on the voltage level of the global word line GWL. The current enable signal generation unit 420 may be coupled to the sensing node SN and may generate the current enable signal CEN based on the voltage level of the sensing node SN. The data output unit 430 may be coupled to the sensing node SN and may receive the read signal RD. The data output unit 430 may generate a data output signal DOUT based on the voltage level of the sensing node SN when the read signal RD is enabled. The data output unit 430 may be required for the read operation of the non-volatile memory apparatus 1.

The snap-back detection circuit 150 may further include an initialization unit 440 and a latch unit 450. The initialization unit 440 may initialize the voltage level of the sensing node SN and the current enable signal CEN based on an enable signal EN. The enable signal EN may be enabled during read and write operations of the non-volatile memory apparatus 1. For example, the enable signal EN may be enabled when at least one between the read signal RD and the write signal WT(RST/SET) is enable. For example, the initialization unit 440 may initialize the voltage level of the sensing node SN to the level of a first power voltage VDD1 and may disable the current enable signal CEN to the level of a second power voltage VDD2, based on the enable signal EN. The second power voltage VDD2 may have a lower level than the first power voltage VDD1. The latch unit 450 may keep the voltage level of the sensing node SN based on the current enable signal CEN. For example, the latch unit 450 may drive the sensing node SN to the level of the second power voltage VDD2 based on the current enable signal CEN. The latch unit 450 may keep, when the current enable signal CEN is enabled, the enabled state of the current enable signal CEN.

Referring to FIG. 4, the sensing unit 410 may include a first transistor T1. For example, the first transistor T1 may be a N-channel MOS transistor. The first transistor T1 may be coupled to the global word line GWL at its gate, may be coupled to the sensing node SN at its drain and may be coupled to the second power voltage VDD2 at its source. The sensing unit 410 may change the voltage level of the sensing node SN to the level of the second power voltage VDD2 when the voltage level of the global word line GWL is increased enough to turn on the first transistor T1. The current enable signal generation unit 420 may include a second transistor T2. For example, the second transistor T2 may be a P-channel MOS transistor. The second transistor T2 may be coupled to the sensing node SN at its gate, may be coupled to the first power voltage VDD1 at its source and may be coupled to an output node of the current enable signal CEN at its drain. The current enable signal generation unit 420 may enable the current enable signal CEN by driving the output node of the current enable signal CEN to the level of the first power voltage VDD1 when the voltage level of the sensing node SN is decreased enough to turn on the second transistor T2. The data output unit 430 may include an AND gate. A first input node of the AND gate may receive the read signal RD and a second input node of the AND gate may be coupled to the sensing node SN. When the read signal RD is enabled to a high level, the data output unit 430 may output the data output signal DOUT having a low level in a case that the voltage level of the sensing node SN is a low level and may output the data output signal DOUT having a high level in a case that the voltage level of the sensing node SN is a high level.

The initialization unit 440 may include a third transistor T3 and a fourth transistor T4. For example, the third transistor T3 may be a P-channel MOS transistor and the fourth transistor T4 may be a N-channel MOS transistor. The third transistor T3 may receive the enable signal EN at its gate, may be coupled to the first power voltage VDD1 at its source and may be coupled to the sensing node SN at its drain. The third transistor T3 may initialize the voltage level of the sensing node SN to a high level by driving the sensing node SN to the first power voltage VDD1 when the enable signal EN is enabled to a low level. The fourth transistor T4 may receive a complementary signal ENB of the enable signal EN at its gate, may be coupled to the output node of the current enable signal CEN at its drain and may be coupled to the second power voltage VDD2 at its source. The fourth transistor T4 may disable the current enable signal CEN to the level of the second power voltage VDD2 and may initialize the current enable signal CEN in response to the complementary signal ENB of the enable signal EN when the enable signal EN is enabled. The latch unit 450 may include a fifth transistor T5. For example, the fifth transistor T5 may be a N-channel MOS transistor. The fifth transistor T5 may receive the current enable signal CEN at its gate, may be coupled to the sensing node SN at its drain and may be coupled to the second power voltage VDD2 at its source. When the current enable signal CEN is enabled to a high level, the fifth transistor T5 may keep the enabled state of the current enable signal CEN by driving the sensing node SN to the level of the second power voltage VDD2.

Figure 5A:
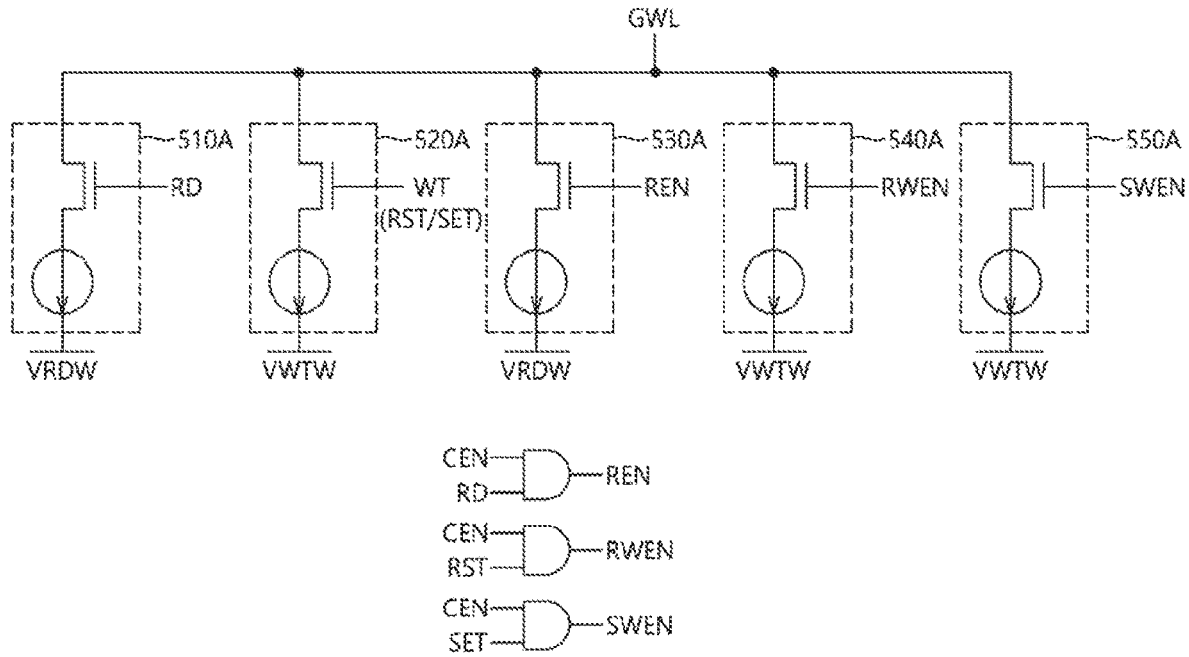
FIGS. 5A and 5B illustrate configurations of a word line control circuit illustrated in FIG. 1.
Figure 5B:
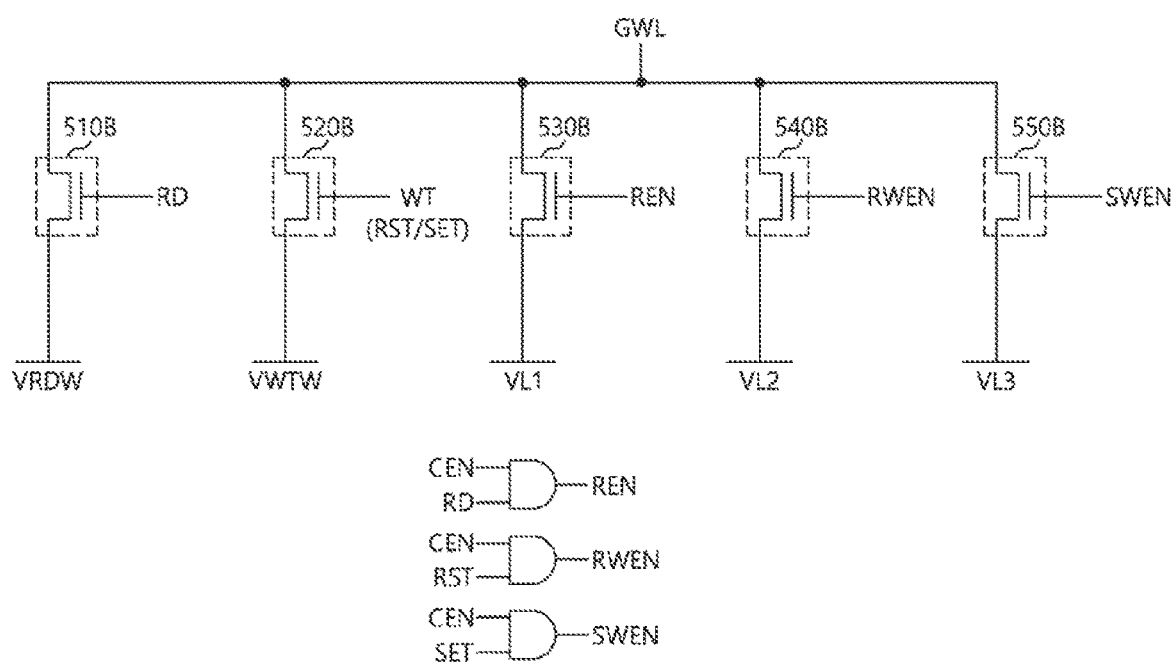

FIGS. 5A and 5B are diagrams illustrating configurations 500A and 500B of the word line control circuit 160 illustrated in FIG. 1. Each of the word line control circuits 500A and 500B may be provided as the word line control circuit 160 illustrated in FIG. 1. Referring to FIG. 5A, the word line control circuit 500A may be implemented with a plurality of current sources. Referring to FIG. 5A, the word line control circuit 500A may include a first snap-back current generation unit 510A, a second snap-back current generation unit 520A, an additional current generation unit 530A, a first write current generation unit 540A and a second write current generation unit 550A. The first snap-back current generation unit 510A and the additional current generation unit 530A may be used for a read operation while the second snap-back current generation unit 520A, the first write current generation unit 540A and the second write current generation unit 550A may be used for a write operation. The first snap-back current generation unit 510A may control a first current to flow through the global word line GWL based on the read signal RD. For example, the first current may have a minimum current amount required to cause a snap-back in the set sells SET CELLS having the low resistance state, as illustrated in FIG. 2. The first snap-back current generation unit 510A may be coupled between the global word line GWL and a word line read bias voltage VRDW. The first snap-back current generation unit 510A may include a current source configured to control the first current to flow through the global word line GWL. The second snap-back current generation unit 520A may control a second current to flow through the global word line GWL based on the write signal WT(RST/SET). The second current may be greater than the first current. For example, the second current may have a minimum current amount required to cause a snap-back in the set sells SET CELLS having the low resistance state and the reset sells RESET CELLS having the high resistance state, as illustrated in FIG. 2. The second snap-back current generation unit 520A may be coupled between the global word line GWL and the word line write bias voltage VWTW. The second snap-back current generation unit 520A may include a current source configured to control the second current to flow through the global word line GWL. The additional current generation unit 530A may increase the amount of a current flowing through the global word line GWL by controlling an additional current to flow through the global word line GWL based on a read enable signal REN. The additional current may be an annealing current. The read enable signal REN may be enabled when the current enable signal CEN and the read signal RD are enabled. The additional current generation unit 530A may be coupled between the global word line GWL and the word line read bias voltage VRDW. The additional current generation unit 530A may include a current source configured to control an additional current to flow through the global word line GWL. The first write current generation unit 540A may control a third current to flow through the global word line GWL based on the reset write enable signal RWEN. The third current may be greater than the second current. The second write current generation unit 550A may control a fourth current to flow through the global word line GWL based on the set write enable signal SWEN. The fourth current may be smaller than the third current and may be greater than the second current. Each of the first write current generation unit 540A and the second write current generation unit 550A may be coupled between the global word line GWL and the word line write bias voltage VWTW. The first write current generation unit 540A and the second write current generation unit 550A may include current sources configured to control the third current and the fourth current to flow through the global word line GWL, respectively.

Referring to FIG. 5B, the word line control circuit 500B may be implemented with a plurality of driving voltages. Referring to FIG. 5B, the word line control circuit 500B may include a first low voltage supply unit 510B, a second low voltage supply unit 520B, a third low voltage supply unit 530B, a fourth low voltage supply unit 540B and a fifth low voltage supply unit 550B. The first low voltage supply unit 510B and the third low voltage supply unit 530B may be used for a read operation while the second low voltage supply unit 520B, the fourth low voltage supply unit 540B and the fifth low voltage supply unit 550B may be used for a write operation. The first low voltage supply unit 510B may drive the global word line GWL to the voltage level of the word line read bias voltage VRDW based on the read signal RD. The first low voltage supply unit 510B may be coupled between the global word line GWL and the word line read bias voltage VRDW. The second low voltage supply unit 520B may drive the global word line GWL to the voltage level of the word line write bias voltage VWTW based on the write signal WT(RST/SET). The second low voltage supply unit 520B may be coupled between the global word line GWL and the word line write bias voltage VWTW. The third low voltage supply unit 530B may drive the global word line GWL to the voltage level of a first low voltage VL1 based on the read enable signal REN. The first low voltage VL1 may have a lower level than the word line read bias voltage VRDW. The third low voltage supply unit 530B may be coupled between the global word line GWL and the first low voltage VL1. The fourth low voltage supply unit 540B may drive the global word line GWL to the voltage level of a second low voltage VL2 based on the reset write enable signal RWEN. The second low voltage VL2 may have a lower level than the word line write bias voltage VWTW. The fourth low voltage supply unit 540B may be coupled between the global word line GWL and the second low voltage VL2. The fifth low voltage supply unit 550B may drive the global word line GWL to the voltage level of a third low voltage VL3 based on the set write enable signal SWEN. The third low voltage VL3 may have a lower level than the word line write bias voltage VWTW and a higher level than the second low voltage VL2. The fifth low voltage supply unit 550B may be coupled between the global word line GWL and the third low voltage VL3.

Figure 6A:
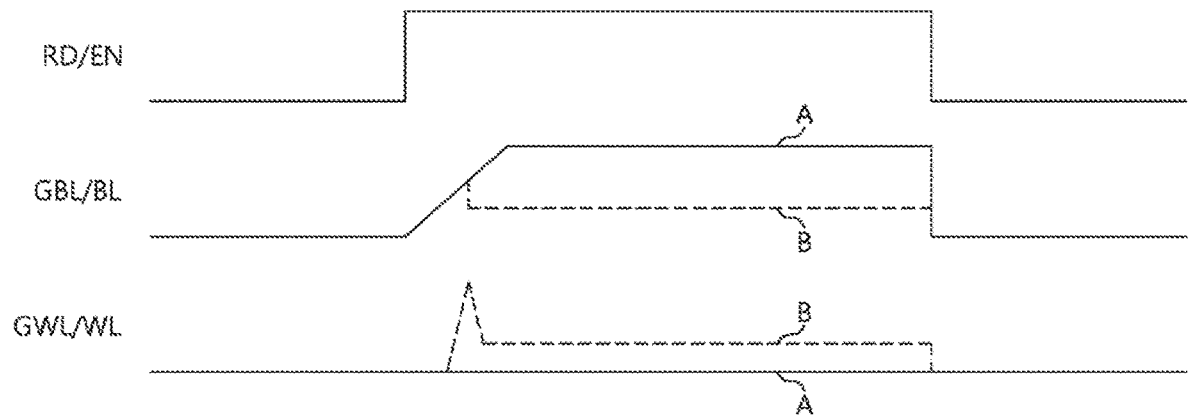
FIGS. 6A and 6B are timing diagrams illustrating read and write operations of a non-volatile memory apparatus in accordance with an embodiment of the present disclosure.
Figure 6B:
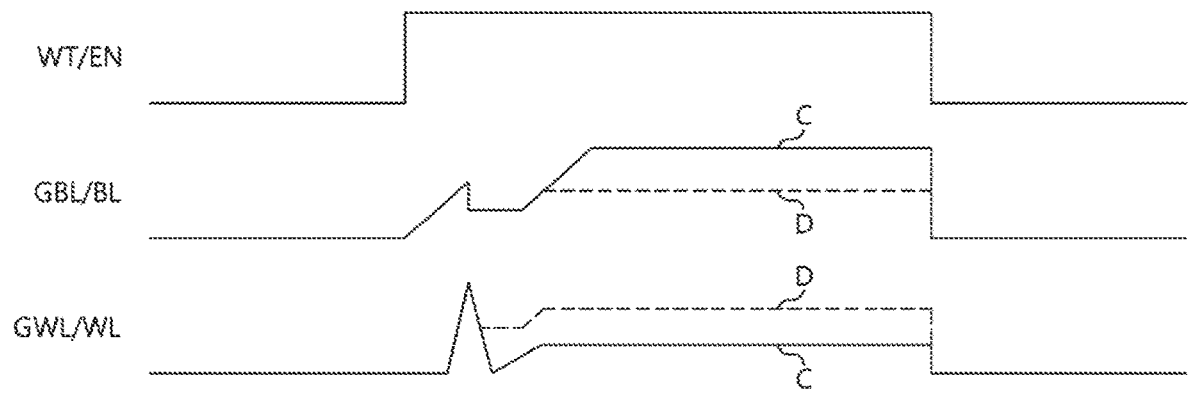

FIGS. 6A and 6B are timing diagrams illustrating read and write operations of the non-volatile memory apparatus 1 in accordance with an embodiment of the present disclosure. FIG. 6A is a timing diagram illustrating a read operation of the non-volatile memory apparatus 1 in accordance with an embodiment of the present disclosure. Described hereafter with reference to FIGS. 1 to 6A will be a read operation of the non-volatile memory apparatus 1 in accordance with an embodiment of the present disclosure. The read signal RD may be enabled when the non-volatile memory apparatus 1 performs a read operation. Also, when the non-volatile memory apparatus 1 performs a read operation, a selected bit line BL may be coupled to the global bit line GBL and a selected word line WL may be coupled to the global word line GWL, by the column selection circuit 120 and the row selection circuit 130. A memory cell MC coupled to the selected bit line BL and the selected word line WL may be accessed. Based on the read signal RD, the bit line control circuit 140 may apply the bit line read bias voltage VRDB to the global bit line GBL and the bit line BL and the word line control circuit 160 may apply the word line read bias voltage VRDW to the global word line GWL and the word line WL, such that a voltage level corresponding to the read voltage VRD is applied across the memory cell MC. The word line control circuit 160 may control a first current, which has a minimum current amount required to cause a snap-back in a memory cell MC having the low resistance state, to flow through the global bit line GBL and/or the memory cell MC.

"A" illustrates voltage levels of the global bit line GBL and the bit line BL and the global word line GWL and the word line WL during a read operation to a memory cell of the high resistance state and/or a reset cell. When the accessed memory cell MC is a memory cell of the high resistance state and/or a reset cell, a snap-back in the accessed memory cell MC might not occur, the voltage levels of the global bit line GBL and the global word line GWL may be kept as is and the voltage level of the sensing node SN may be kept in the initialized state. The snap-back detection circuit 150 may keep the disabled state of the current enable signal CEN. The data output unit 430 may output the data output signal DOUT having a high level and the read operation may end.

"B" illustrates voltage levels of the global bit line GBL and the bit line BL and the global word line GWL and the word line WL during a read operation to a memory cell of the low resistance state and/or a set cell. When the accessed memory cell MC is a memory cell of the low resistance state and/or a set cell, a snap-back in the accessed memory cell MC may occur. Due to the snap-back, a spike current may flow through the memory cell MC. Therefore, the voltage levels of the global bit line GBL and the bit line BL may be lowered while the voltage levels of the global word line GWL and the word line WL may be raised. The sensing unit 410 of the snap-back detection circuit 150 may detect the increased voltage level of the global word line GWL and may change the voltage level of the sensing node SN to a low level and the data output unit 430 may generate the data output signal DOUT having a low level. The current enable signal generation unit 420 of the snap-back detection circuit 150 may enable the current enable signal CEN according to the voltage level of the sensing node SN. When the current enable signal CEN is enabled, the word line control circuit 160 may lower the voltage level of the global word line GWL by controlling an additional current to flow through the global word line GWL or driving the global word line GWL to a level of the first low voltage VL1. When the additional current flows through the global word line GWL, an annealing current may additionally flow through the memory cell MC. Therefore, the memory cell MC may be stably kept and/or formed in the low resistance state. In accordance with an embodiment of the present disclosure, the non-volatile memory apparatus 1 may perform a read operation by using a minimum current required to cause a snap-back in a memory cell having a low resistance state during the read operation, and thus durability of the memory cell may last long and disturbance may be mitigated. Further, the annealing current may be additionally provided to the memory cell having the low resistance state and thus the memory cell may be stably kept in the low resistance state.

FIG. 6B is a timing diagram illustrating a write operation of the non-volatile memory apparatus 1 in accordance with an embodiment of the present disclosure. Described hereafter with reference to FIGS. 1 to 5B and 6B will be a write operation of the non-volatile memory apparatus 1 in accordance with an embodiment of the present disclosure. The write signal WT(RST/SET) may be enabled when the non-volatile memory apparatus 1 performs a write operation. Also, when the non-volatile memory apparatus 1 performs a write operation, a selected bit line BL may be coupled to the global bit line GBL and a selected word line WL may be coupled to the global word line GWL, by the column selection circuit 120 and the row selection circuit 130. A memory cell MC coupled to the selected bit is line BL and the selected word line WL may be accessed. Based on the write signal WT(RST/SET), the bit line control circuit 140 may apply the bit line write bias voltage VWTB to the global bit line GBL and the bit line BL and the word line control circuit 160 may apply the word line write bias voltage VWTW to the global word line GWL and the word line WL, such that a voltage level corresponding to the write voltage VWT is applied across the memory cell MC. The word line control circuit 160 may control a second current, which has a minimum current amount required to cause a snap-back in a memory cell MC having the high resistance state and a memory cell MC having the low resistance state, to flow through the global bit line GBL and/or the memory cell MC.

Due to the snap-back, a spike current may flow through the memory cell MC. Therefore, the voltage levels of the global bit line GBL and the bit line BL may be lowered while the voltage levels of the global word line GWL and the word line WL may be raised. The sensing unit 410 of the snap-back detection circuit 150 may detect the increased voltage level of the global word line GWL and may change the voltage level of the sensing node SN to a low level and the current enable signal generation unit 420 of the snap-back detection circuit 150 may enable the current enable signal CEN according to the voltage level of the sensing node SN.

"C" illustrates voltage levels of the global bit line GBL and the bit line BL and the global word line GWL and the word line WL during a reset write operation. The reset write enable signal RWEN may be enabled when the write operation is a reset write operation. The bit line control circuit 140 may drive the global bit line GBL and the bit line BL to the level of the first high voltage VH1. The word line control circuit 160 may control the third current to flow through the global word line GWL and the memory cell MC or may drive the global word line GWL to the level of the second low voltage VL2. Therefore, the voltage level of the global word line GWL may be sufficiently lowered and an enough of an amount of a current may flow through the memory cell MC to allow the memory cell MC to be in the high resistance state.

"D" illustrates voltage levels of the global bit line GBL and the bit line BL and the global word line GWL and the word line WL during a set write operation. The set write enable signal SWEN may be enabled when the write operation is a set write operation. The bit line control circuit 140 may drive the global bit line GBL and the bit line BL to the level of the second high voltage VH2. The word line control circuit 160 may control the fourth current to flow through the global word line GWL and the memory cell MC or may drive the global word line GWL to the level of the third low voltage VL3. Therefore, the voltage level of the global word line GWL may be lowered and an enough amount of a current may flow through the memory cell MC to allow the memory cell MC to be in the low resistance state. In accordance with an embodiment of the present disclosure, the non-volatile memory apparatus 1 may use a minimum amount of a current to cause a snap-back in all of set and reset cells and may variably increase an amount of a required current according to the reset write operation or the set write operation. Therefore, the non-volatile memory apparatus 1 may reduce power consumption thereof.

Figure 7:
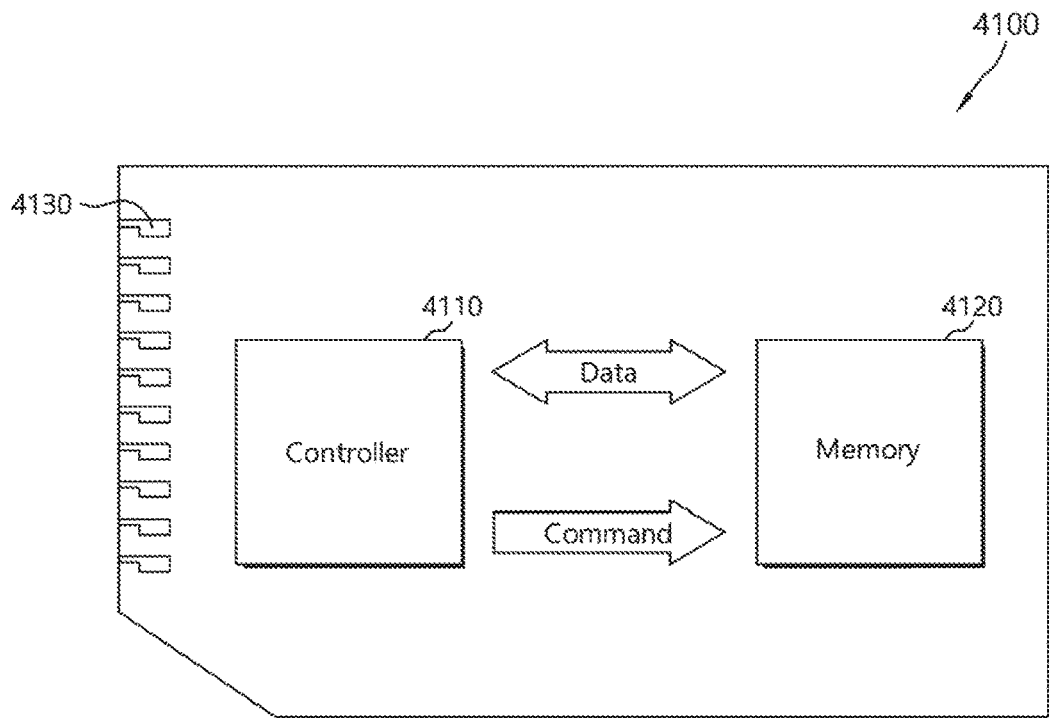
FIG. 7 illustrates a diagram illustrating a memory card including the semiconductor memory apparatus in accordance with an embodiment.

FIG. 7 illustrates a diagram illustrating a memory card including the semiconductor memory apparatus in accordance with some embodiments. Referring to FIG. 7, the memory card system 4100 may include a controller 4110, a memory 4120, and interface members 4130. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an exterior. The memory 4120 may include the nonvolatile memory apparatus 1 according to the above-described embodiments.

The interface members 4130 may control the input/output of data from/to the exterior. The memory card system 4100 may be a multimedia card (MMC), a secure digital card (SD), or a portable data storage device.

Figure 8:
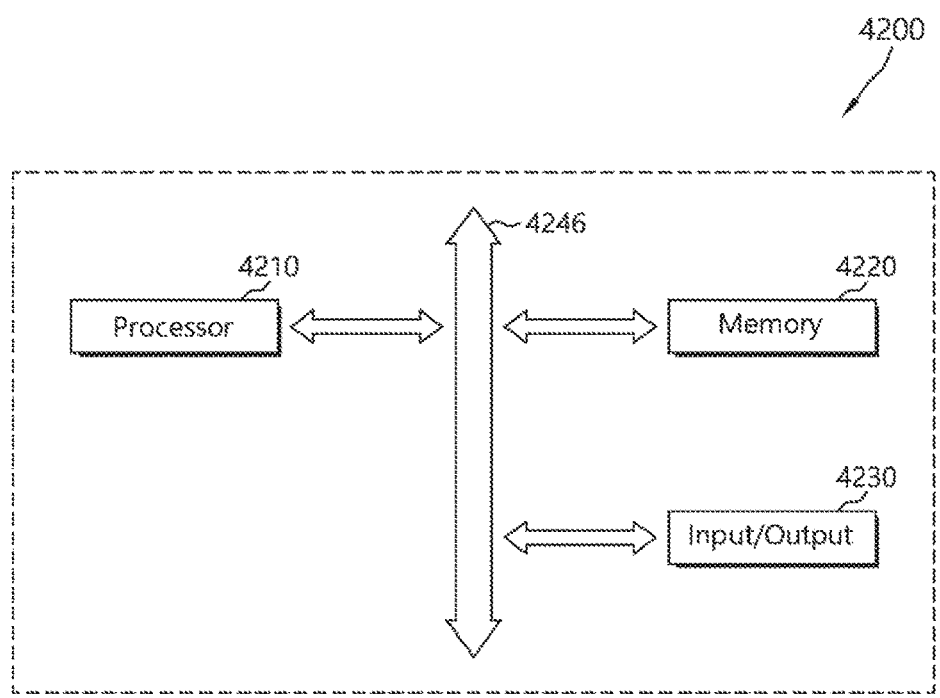
FIG. 8 illustrates a block diagram to assist in the explanation of an electronic apparatus including a semiconductor memory apparatus in accordance with an embodiment.

FIG. 8 illustrates a block diagram to assist in the explanation of an electronic apparatus including the semiconductor memory apparatus in accordance with some embodiments. Referring to FIG. 8, the electronic apparatus 4200 may include a processor 4210, a memory 4220, and an input/output device 4230. The processor 4210, the memory 4220, and the input/output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include the nonvolatile memory apparatus 1 according to the above-described embodiments. In order for detailed realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or all devices capable of transmitting and receiving information under wireless circumstances.

Descriptions appear below for the detailed realization and modified examples of the electronic apparatus 4200, with reference to FIGS. 9 and 10.

Figure 9:
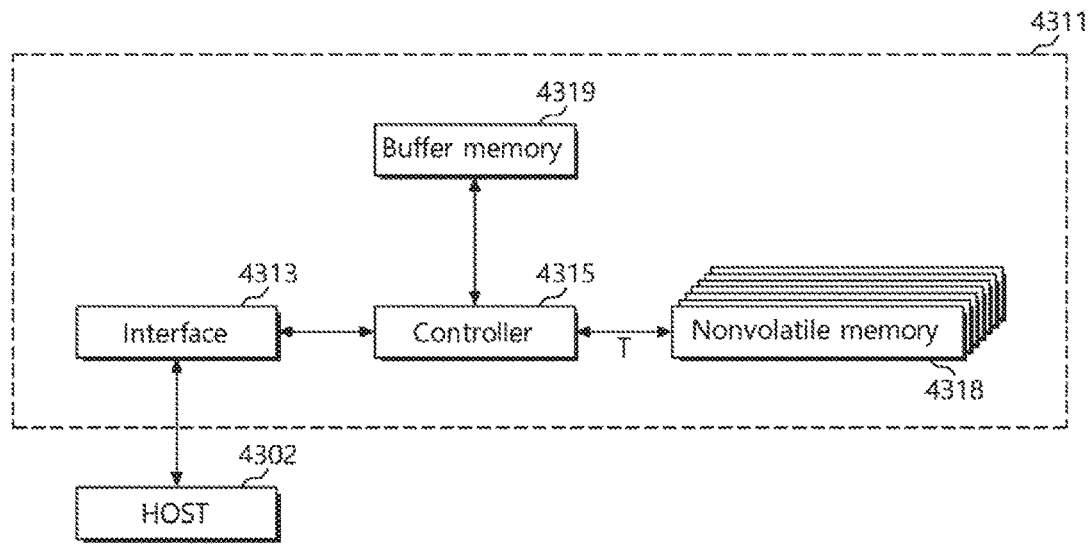
FIG. 9 illustrates a block diagram illustrating a data storage device including a semiconductor memory apparatus in accordance with an embodiment.

FIG. 9 illustrates a block diagram illustrating a data storage device including the semiconductor memory apparatus in accordance with some embodiments. Referring to FIG. 9, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides advantages in that speed is high, additionally, a mechanical delay, a failure rate, heat generation, and noise generation decrease, and miniaturization, and light weight may be accomplished, when compared to a hard disk drive (HDD). The solid state disk 4311 may be widely used in a notebook PC, a net book, a desktop PC, an MP3 player, or a portable storage device.

The controller 4315 may be formed adjacent to the interface 4313, and be electrically coupled to the interface 4313. The controller 4315 may be a microprocessor including a memory controller and a buffer controller. The nonvolatile memories 4318 may be formed adjacent to the controller 4315, and be electrically coupled to the controller 4315 via connection terminals T. The data storage capacity of the solid state disk 4311 may correspond to the nonvolatile memories 4318. The buffer memory 4319 may be formed adjacent to the controller 4315, and be electrically coupled to the controller 4315.

The interface 4313 may be coupled to a host 4302, and play the role of transmitting and receiving electrical signals such as data. For example, the interface 4313 may be a device which uses the same protocol as SATA, IDE, SCSI, and/or combination thereof. The nonvolatile memories 4318 may be coupled to the interface 4313 via the controller 4315.

The nonvolatile memories 4318 may play the role of storing the data received through the interface 4313. Each of the nonvolatile memories 4318 may include the semiconductor memory apparatus according to above-described embodiments. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include the nonvolatile memory apparatus 1 according to above-described embodiments.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

Figure 10:
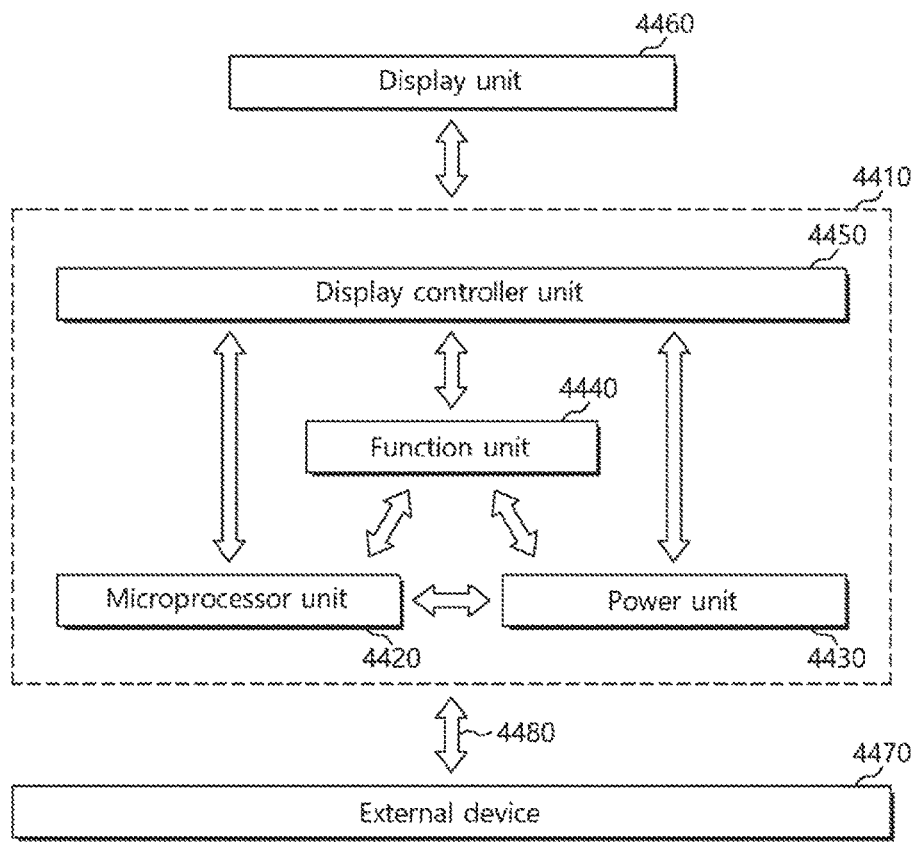
FIG. 10 illustrates a block diagram illustrating an electronic system including a semiconductor memory apparatus in accordance with an embodiment.

FIG. 10 illustrates a block diagram illustrating an electronic system including the semiconductor memory apparatus in accordance with some embodiments. Referring to FIG. 10, the electronic system 4400 may include a body 4410, a microprocessor unit 4420, a power unit 4430, a function unit 4440, and a display controller unit 4450.

The body 4410 may be a motherboard which is formed by a printed circuit board (PCB). The microprocessor unit 4420, the power unit 4430, the function unit 4440, and the display controller unit 4450 may be mounted to the body 4410. A display unit 4460 may be disposed inside the body 4410 or outside the body 4410. For example, the display unit 4460 may be disposed on the surface of the body 4410, and display the image processed by the display controller unit 4450.

The power unit 4430 may play the role of receiving a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430, and control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. In the case where a camera is mounted together, the function unit 4440 may also play the role of a camera image processor.

In the case where the electronic system 4400 is coupled with a memory card or the like to extend capacity, the function unit 4440 may be a memory card controller. The function unit 4440 may exchange signals with the external device 4470 through a wired or wireless communication unit 4480. In the case where the electronic system 4400 needs a USB or the like to expand functionality, the function unit 4440 may play the role of an interface controller. The semiconductor memory apparatus in accordance with the above-described embodiments may be applied as at least any one of the microprocessor unit 4420 and the function unit 4440.

While certain embodiments have been described above, it will be understood to those skilled in the art that the embodiments described are by way of example only. Accordingly, the nonvolatile memory apparatus, and read and write method thereof should not be limited based on the described embodiments. Rather, the nonvolatile memory apparatus, and read and write method thereof described herein should only be limited in light of the claims that follow when taken in conjunction with the above description and accompanying drawings.

What is claimed is:
1. A non-volatile memory apparatus comprising:
a memory cell coupled between a global bit line and a global word line;
a bit line control circuit configured to apply a bit line read bias voltage to the global bit line based on a read signal;
a snap-back detection circuit coupled to the global word line, and configured to generate a data output signal and a current enable signal by detecting a snap-back of the memory cell; and
a word line control circuit configured to apply a word line read bias voltage to the global word line based on the read signal, and increase an amount of a current flowing through the memory cell based on the current enable signal,
wherein the word line control circuit includes a snap-back current generation unit configured to control a first current to flow through the global word line based on the read signal, and an additional current generation unit configured to control an additional current to flow through the global word line based on the current enable signal.

2. The non-volatile memory apparatus of claim 1,
wherein voltage level difference between the bit line read bias voltage and the word line read bias voltage corresponds to a voltage level of a read voltage, and
wherein the read voltage has a voltage level corresponding to a voltage between a set distribution maximum voltage and a reset distribution minimum voltage.

3. The non-volatile memory apparatus of claim 1,
wherein the snap-back detection circuit enables the current enable signal and the word line control circuit increases the amount of the current flowing through the memory cell, when a snap-back of the memory cell occurs, and
wherein the snap-back detection circuit disables the current enable signal when a snap-back of the memory cell does not occur.

4. The non-volatile memory apparatus of claim 1, wherein the snap-back detection circuit includes:

a sensing unit configured to change a voltage level of a sensing node based on a voltage level of the global word line;
a data output unit configured to generate the data output signal based on the voltage level of the sensing node and the read signal; and
a current enable signal generation unit configured to generate the current enable signal based on the voltage level of the sensing node.

5. The non-volatile memory apparatus of claim 4, further comprising an initialization unit configured to initialize the voltage level of the sensing node and the current enable signal based on the read signal.

6. The non-volatile memory apparatus of claim 4, further comprising a latch unit configured to maintain, when the current enable signal is enabled, the enabled state of a voltage level of the current enable signal.

7. The non-volatile memory apparatus of claim 1, wherein the increased current flowing through the memory cell is an annealing current for maintaining the memory cell in a low resistance state.

8. A non-volatile memory apparatus comprising:
a memory cell coupled between a global bit line and a global word line;
a bit line control circuit configured to apply a bit line read bias voltage to the global bit line based on a read signal;
a snap-back detection circuit coupled to the global word line, and configured to generate a data output signal and a current enable signal by detecting a snap-back of the memory cell; and
a word line control circuit configured to apply a word line read bias voltage to the global word line based on the read signal, and increase an amount of a current flowing through the memory cell based on the current enable signal,
wherein the word line control circuit includes a first low voltage supply unit configured to drive the global word line to a voltage level of the word line read bias voltage based on the read signal, and a second low voltage supply unit configured to drive the global word line to a voltage level of a first low voltage, which is lower than the word line read bias voltage, based on the current enable signal.

9. A non-volatile memory apparatus comprising:
a memory cell coupled between a global bit line and a global word line;
a bit line control circuit configured to apply a bit line write bias voltage to the global bit line based on at least one of a reset write signal and a set write signal, and variably change a voltage level of the global bit line based on a current enable signal, the reset write signal, and the set write signal;
a snap-back detection circuit coupled to the global word line, and configured to generate the current enable signal by detecting a snap-back of the memory cell; and
a word line control circuit configured to apply a word line write bias voltage to the global word line based on at least one of the reset write signal and the set write signal, and increase an amount of a current flowing through the memory cell based on the current enable signal.

10. The non-volatile memory apparatus of claim 9,
Wherein voltage level difference between the bit line write bias voltage and the word line write bias voltage corresponds to a voltage level of a write voltage, and
wherein the write voltage has a level equal to or greater than a reset distribution maximum voltage.

11. The non-volatile memory apparatus of claim 9,
wherein the snap-back detection circuit enables the current enable signal and the word line control circuit increases the amount of the current flowing through the memory cell, when a snap-back of the memory cell occurs, and
wherein the snap-back detection circuit disables the current enable signal when a snap-back of the memory cell does not occur.

12. The non-volatile memory apparatus of claim 9, wherein the snap-back detection circuit includes:
a sensing unit configured to change a voltage level of a sensing node based on a voltage level of the global word line; and
a current enable signal generation unit configured to generate the current enable signal based on the voltage level of the sensing node.

13. The non-volatile memory apparatus of claim 12, further comprising an initialization unit configured to initialize the voltage level of the sensing node and the current enable signal based on at least one of the reset write signal and the set write signal.

14. The non-volatile memory apparatus of claim 12, further comprising a latch unit configured to maintain, when the current enable signal is enabled, the enabled state of a voltage level of the current enable signal.

15. The non-volatile memory apparatus of claim 9,
wherein the bit line control circuit increases a voltage level of the global bit line to a higher level than a voltage level of the bit line write bias voltage based on the current enable signal and the reset write signal, and
wherein the bit line control circuit decreases the voltage level of the global bit line to a lower level than the voltage level of the bit line write bias voltage based on the current enable signal and the set write signal.

16. The non-volatile memory apparatus of claim 9, wherein the word line control circuit includes:
a snap-back current generation unit configured to control a first current to flow through the global word line based on at least one of the reset write signal and the set write signal;
a first write current generation unit configured to control a second current, which has a greater amount than the first current, to flow through the global word line based on the current enable signal and the reset write signal; and
a second write current generation unit configured to control a third current, which has a greater amount than the first current and a smaller amount than the second current, to flow through the global word line based on the current enable signal and the set write signal.

17. The non-volatile memory apparatus of claim 9, wherein the word line control circuit includes:
a first low voltage supply unit configured to drive the global word line to a voltage level of the word line write bias voltage based on at least one of the reset write signal and the set write signal;
a second low voltage supply unit configured to drive the global word line to a voltage level of a first low voltage based on the current enable signal and the reset write signal; and
a third low voltage supply unit configured to drive the global word line to a voltage level of a second low voltage, which has a higher level than the first low voltage, based on the current enable signal and the set write signal.

18. A write method of a non-volatile memory apparatus, the write method comprising:
applying a write voltage, which is for causing a snap-back in a memory cell of a low resistance state or a memory cell of a high resistance state, across a memory cell coupled between a global bit line and a global word line; and
changing an amount of a current flowing the memory cell according to a reset write signal, a set write signal and whether a snap-back of the memory cell occurs,
wherein the write voltage has a level equal to or greater than a reset distribution maximum voltage.

19. The write method of claim 18, wherein the changing of the amount of the current includes, when there occurs a snap-back in the memory cell:
increasing the amount of the current flowing through the memory cell by an amount of a first current during a reset write operation; and
increasing the amount of the current flowing through the memory cell by an amount of a second current, which is smaller than the first current, during a set write operation.

20. The write method of claim 18, wherein the changing of the amount of the current includes, when there occurs a snap-back in the memory cell:
lowering a voltage level of the global bit line and lowering a voltage level of the global word line, during a reset write operation; and
raising the voltage level of the global bit line and lowering the voltage level of the global word line, during a set write operation.

* * * * *